US007948030B2

(12) United States Patent
Lindholm et al.

(10) Patent No.: US 7,948,030 B2
(45) Date of Patent: May 24, 2011

(54) SEMICONDUCTOR CONSTRUCTIONS OF MEMORY DEVICES WITH DIFFERENT SIZES OF GATELINE TRENCHES

(75) Inventors: Larson Lindholm, Boise, ID (US);
Aaron R. Wilson, Boise, ID (US);
David K. Hwang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/875,828

(22) Filed: Sep. 3, 2010

(65) Prior Publication Data

US 2010/0327369 A1 Dec. 30, 2010

Related U.S. Application Data

(60) Continuation of application No. 12/628,910, filed on Dec. 1, 2009, now Pat. No. 7,808,041, which is a division of application No. 11/652,863, filed on Jan. 12, 2007, now Pat. No. 7,648,915.

(51) Int. Cl.
*H01L 29/76* (2006.01)

(52) U.S. Cl. ........ 257/330; 257/331; 257/332; 257/333; 257/E29.201; 257/E29.26

(58) Field of Classification Search .................. 257/330, 257/331, 332, 333, E29.201, E29.26
See application file for complete search history.

(56) References Cited

U.S. PATENT DOCUMENTS

| 7,034,359 B2 | 4/2006 | Harada |
| 7,419,859 B2 | 9/2008 | Kim et al. |
| 7,517,764 B2 | 4/2009 | Booth et al. |
| 2005/0145936 A1 | 7/2005 | Polzl et al. |
| 2006/0281313 A1 | 12/2006 | Chou et al. |
| 2007/0059922 A1 | 3/2007 | Clevenger et al. |
| 2007/0267668 A1 | 11/2007 | Fischer |

*Primary Examiner* — Thanh V Pham
(74) *Attorney, Agent, or Firm* — Wells St. John P.S.

(57) ABSTRACT

Some embodiments include methods of recessing multiple materials to a common depth utilizing etchant comprising $C_4F_6$ and $C_4F_3$. The recessed materials may be within isolation regions, and the recessing may be utilized to form trenches for receiving gatelines. Some embodiments include structures having an island of semiconductor material laterally surrounded by electrically insulative material. Two gatelines extend across the insulative material and across the island of semiconductor material. One of the gatelines is recessed deeper into the electrically insulative material than the other.

11 Claims, 17 Drawing Sheets

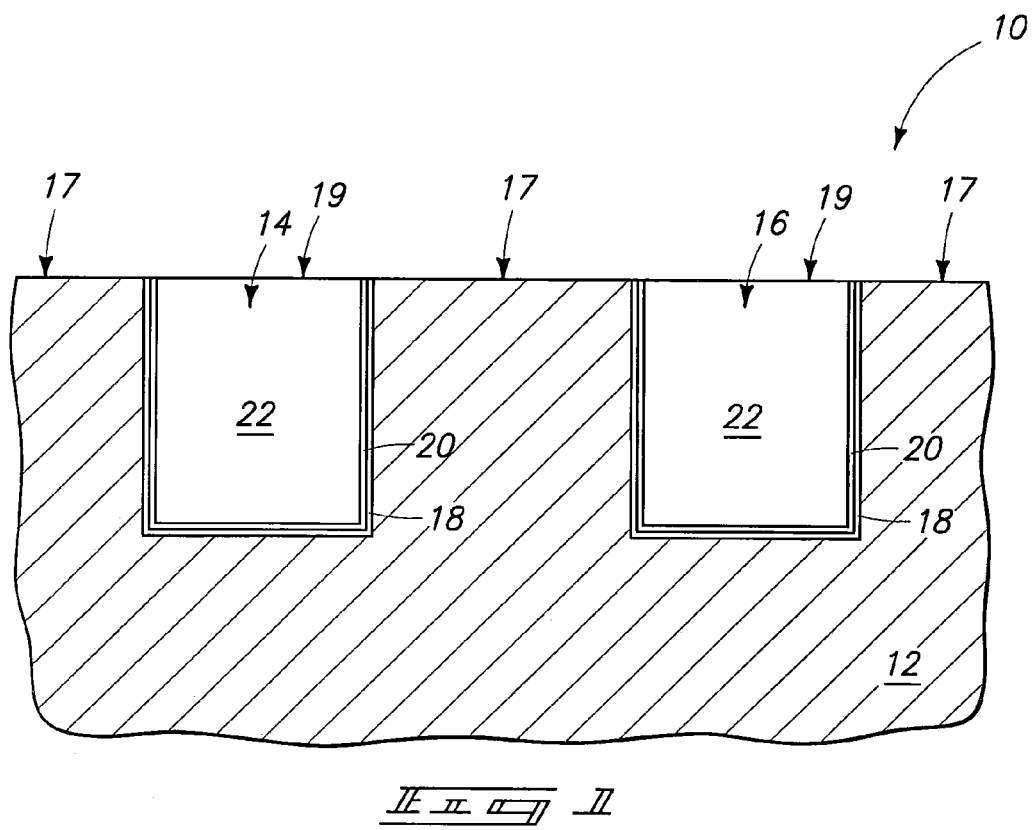
_Fig. 1_
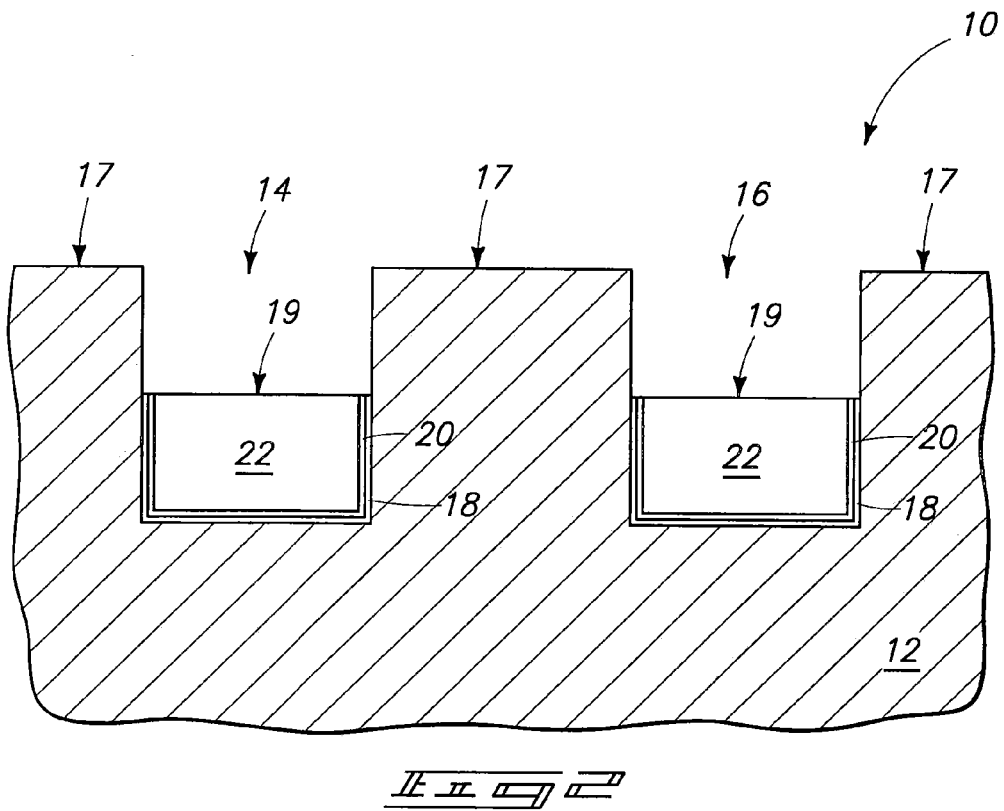
_Fig. 2_

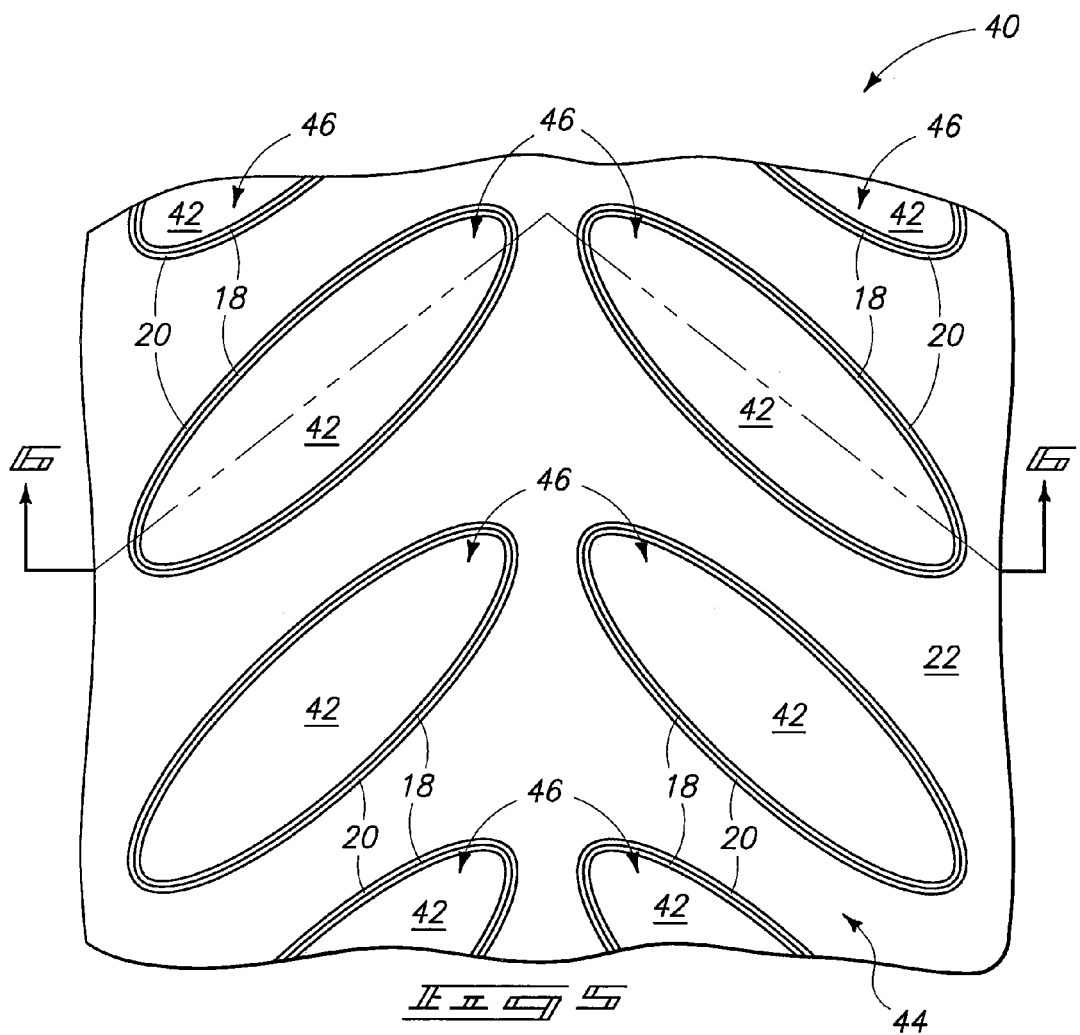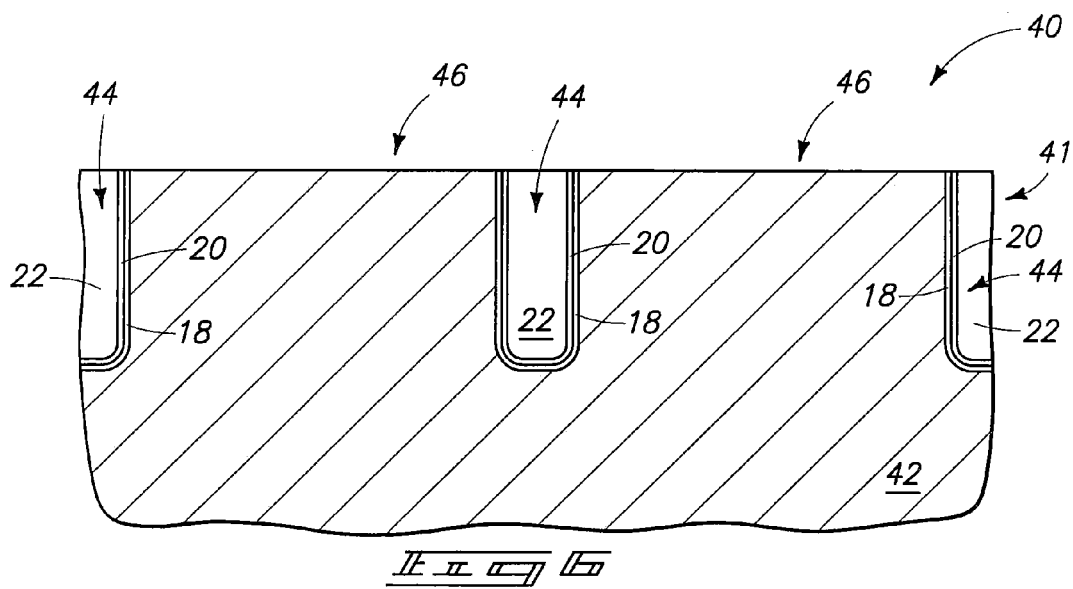

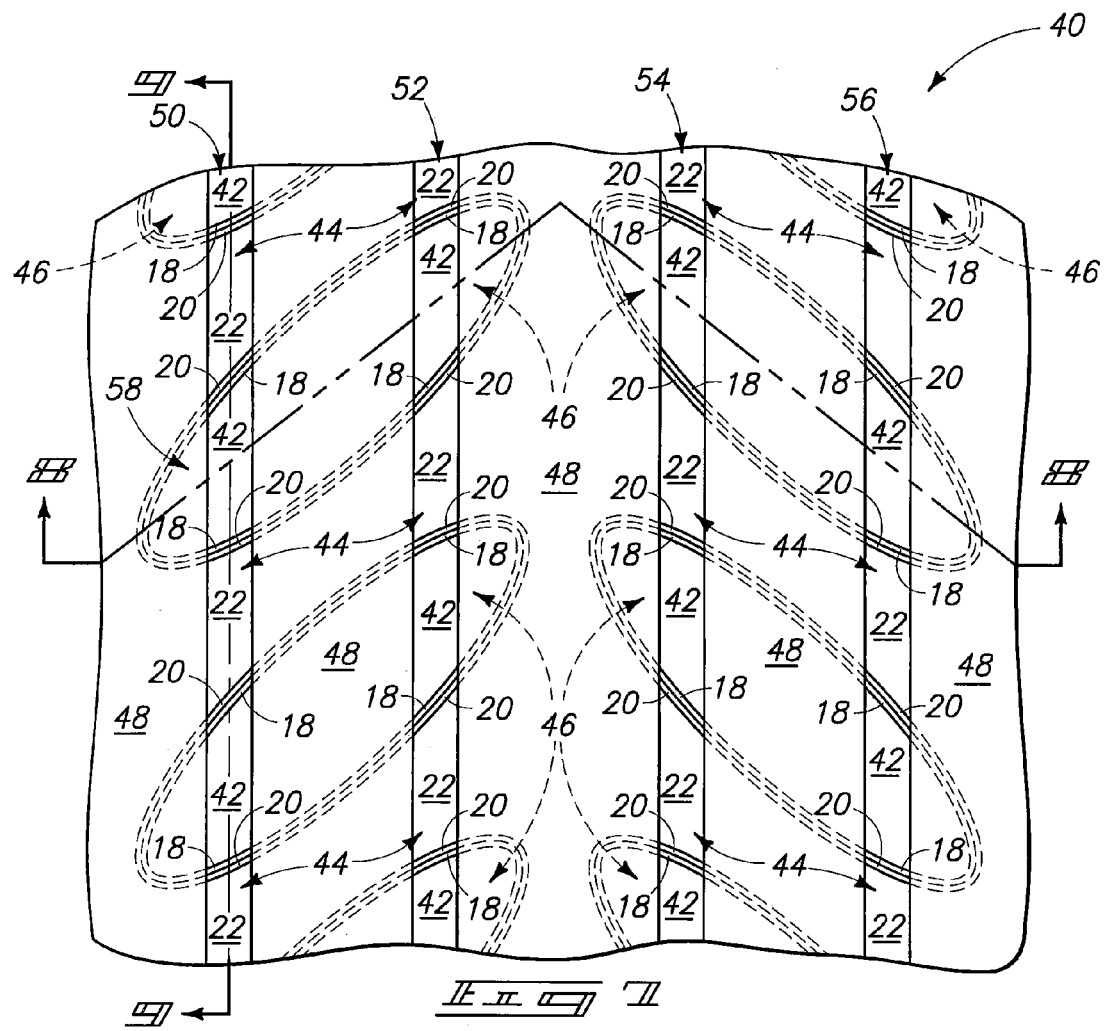
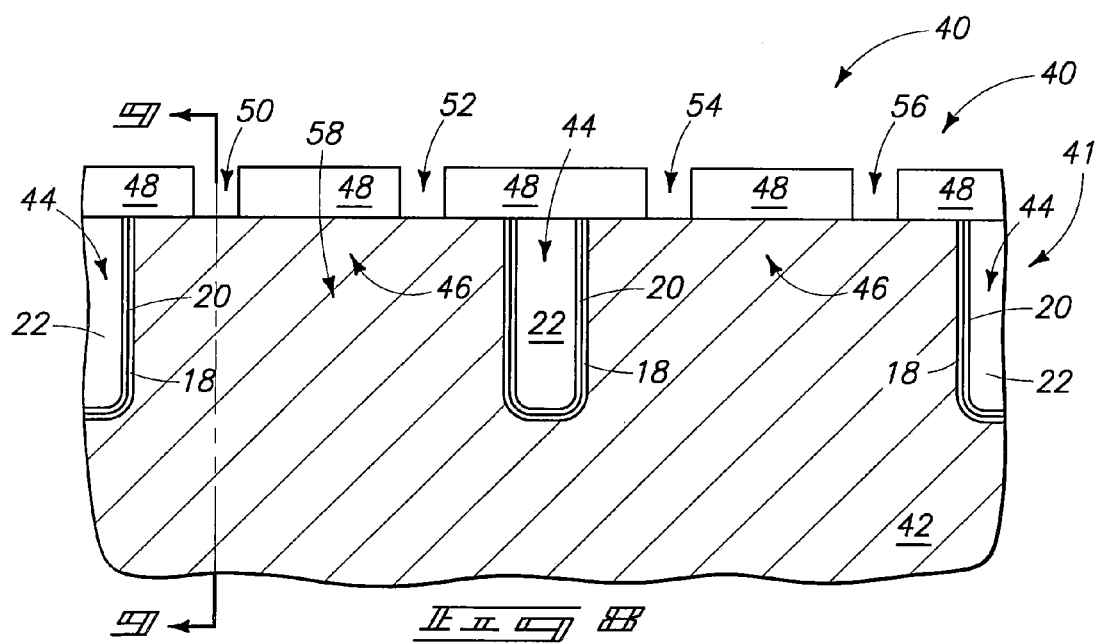

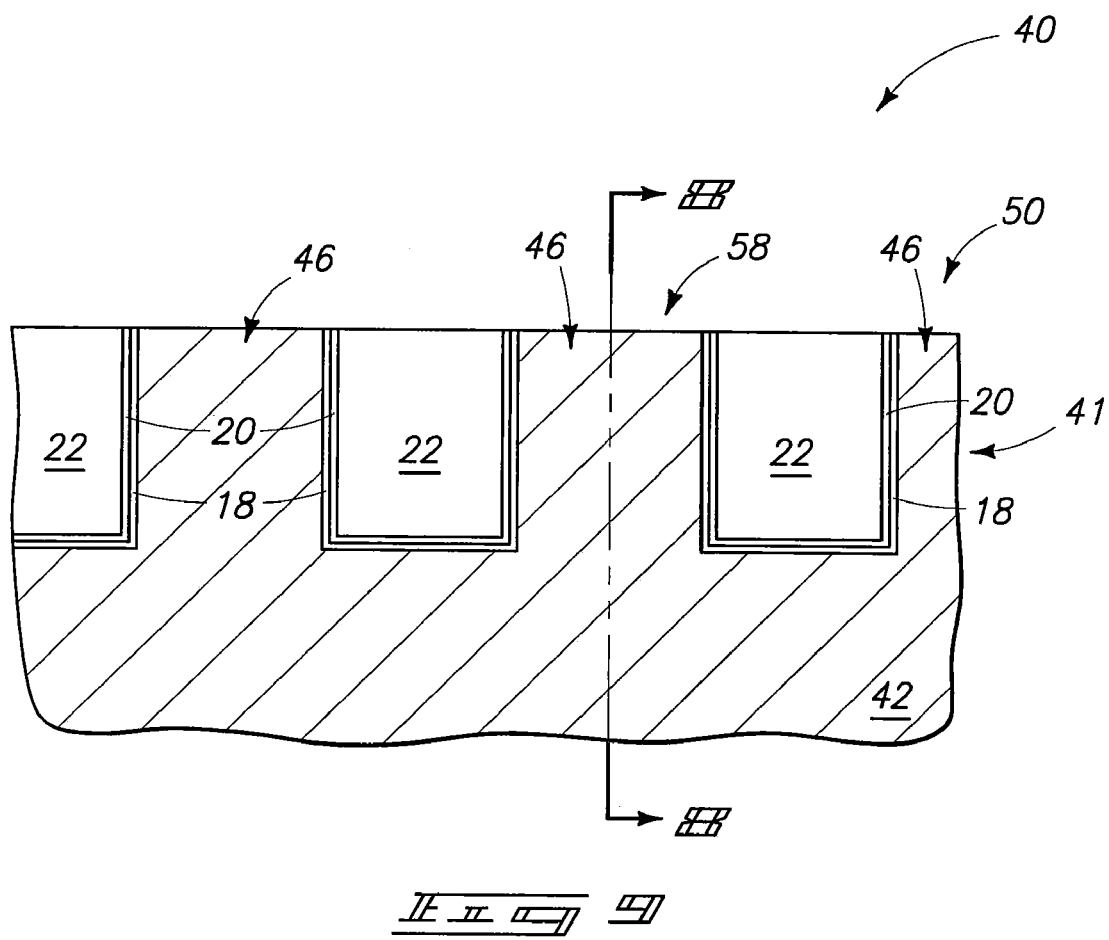
F I G 9

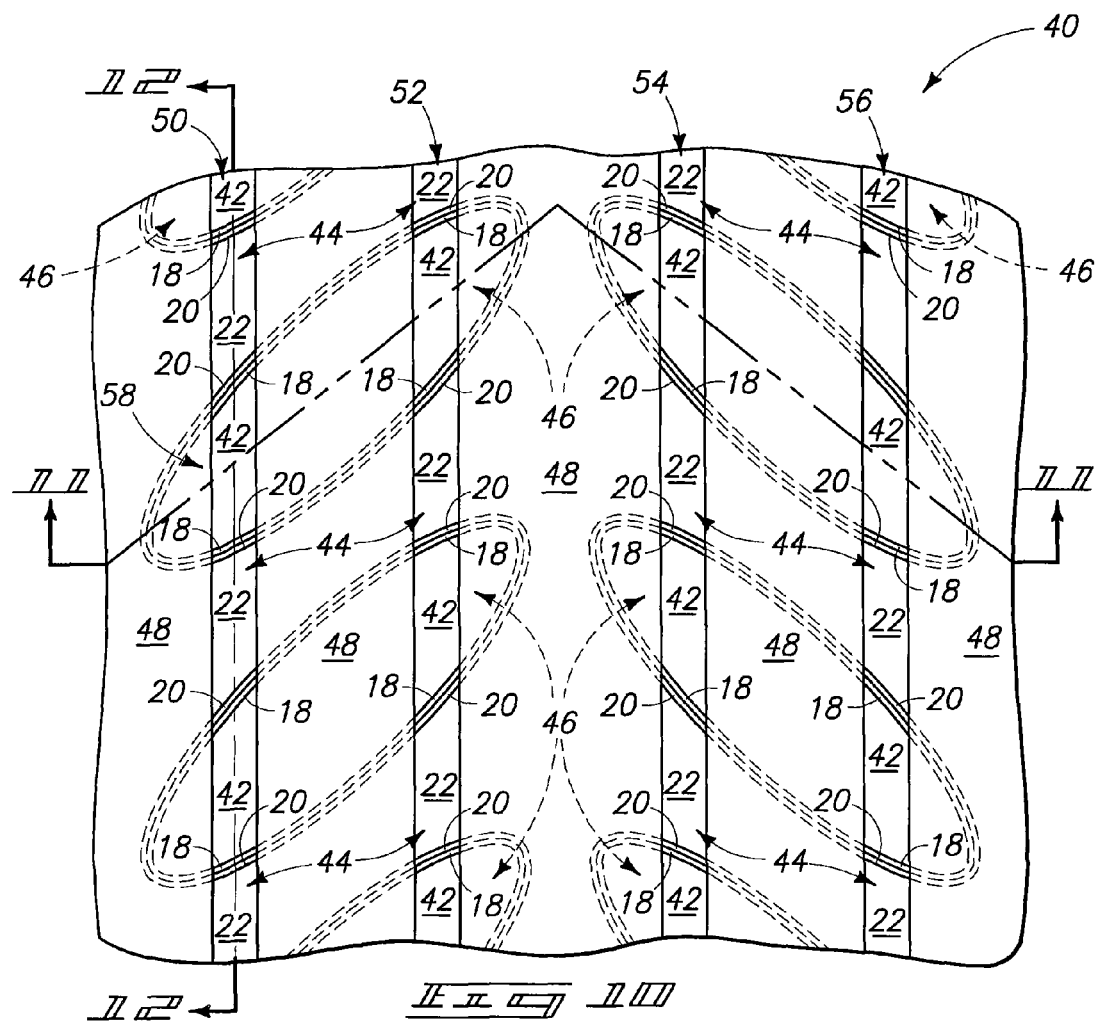
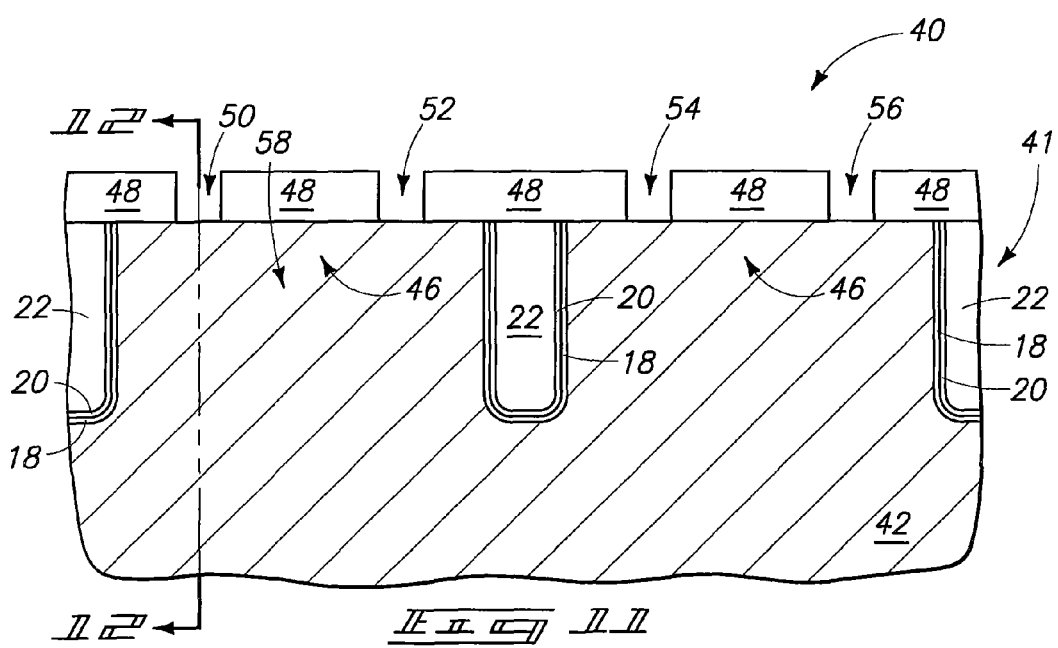

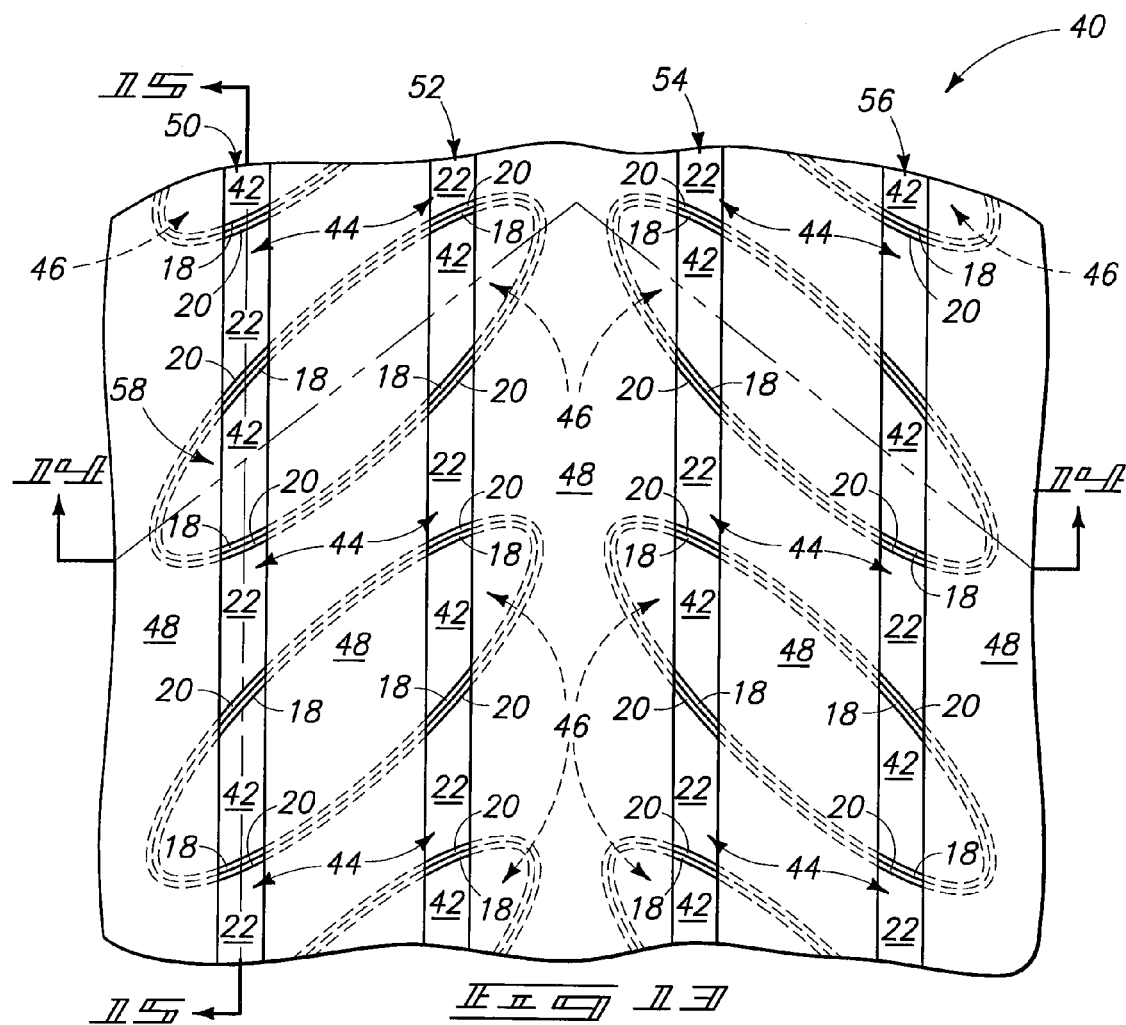
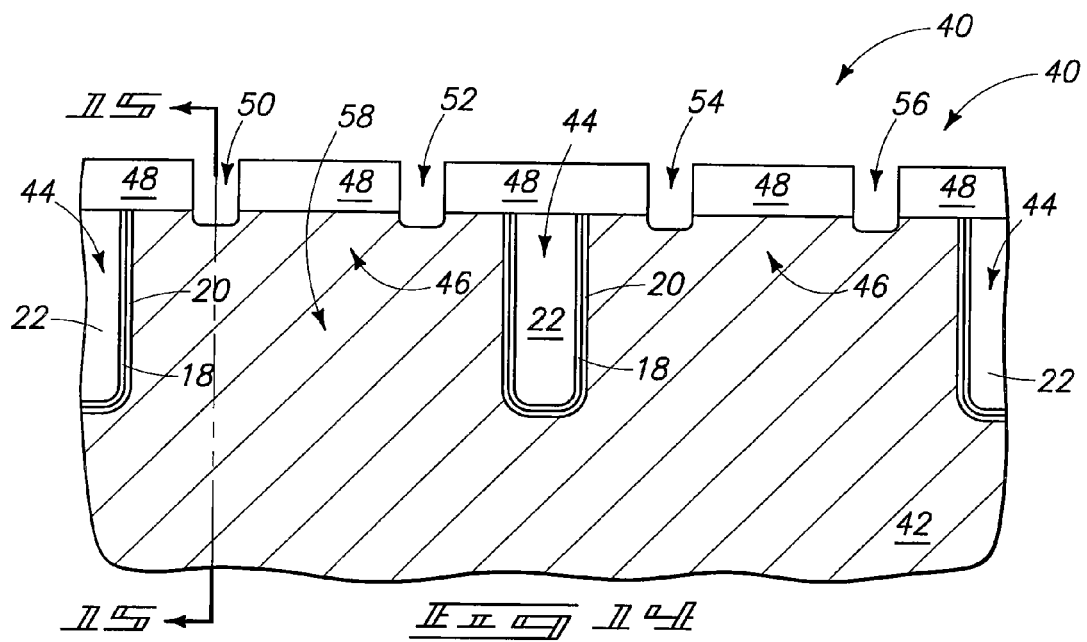

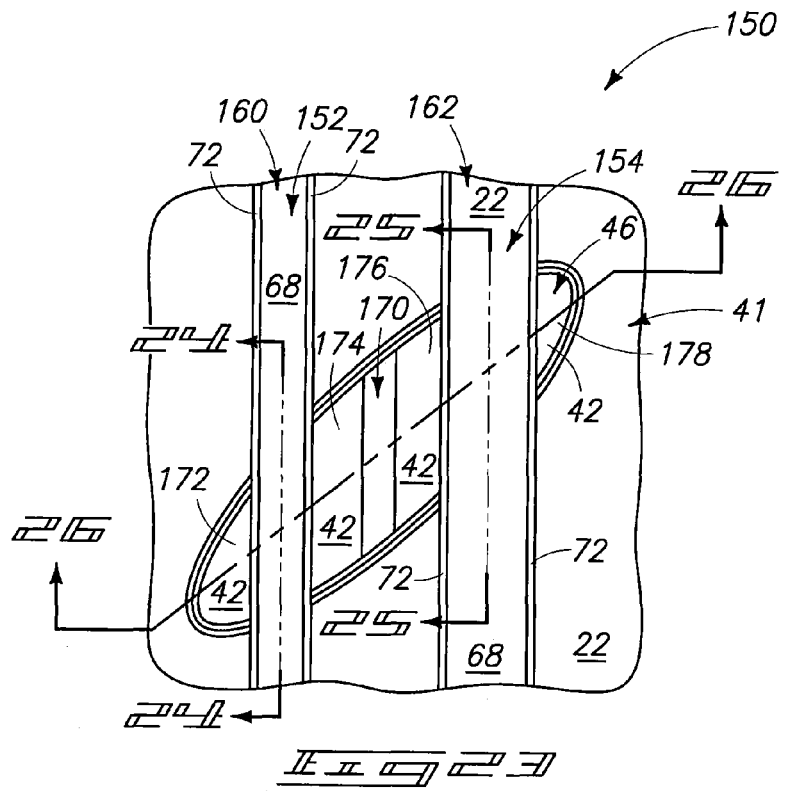
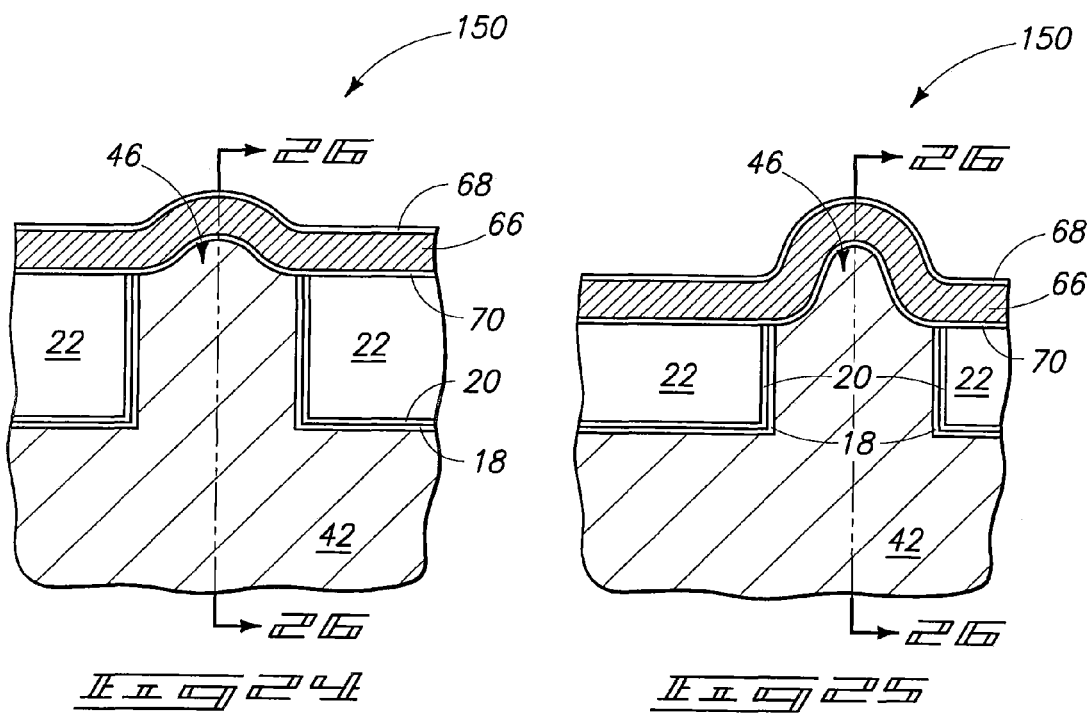

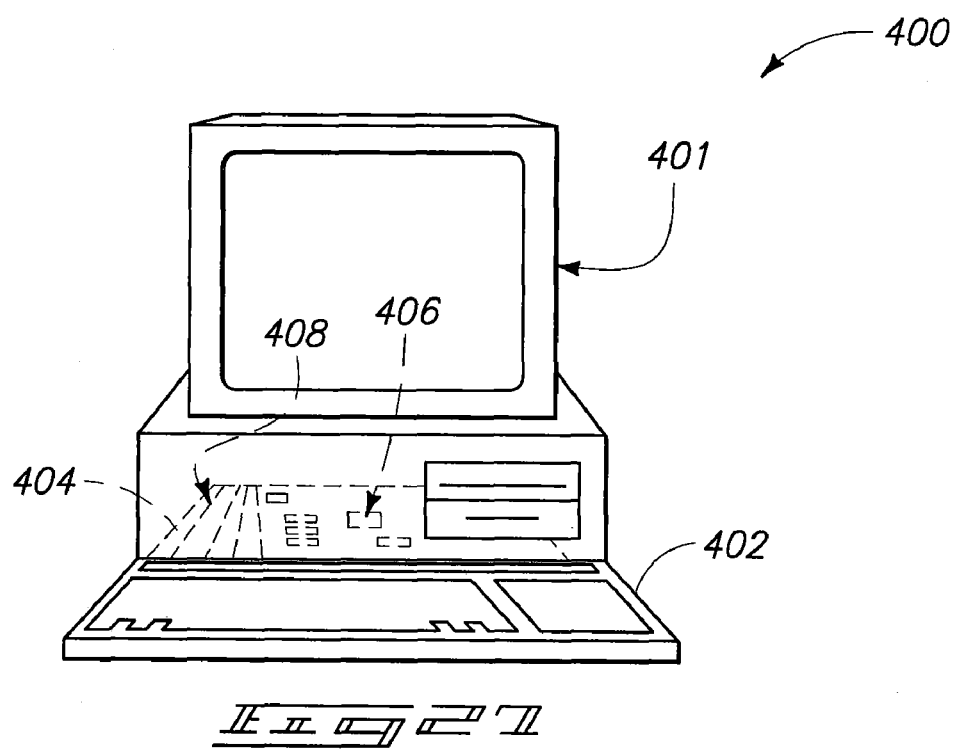
_Fig. 27_
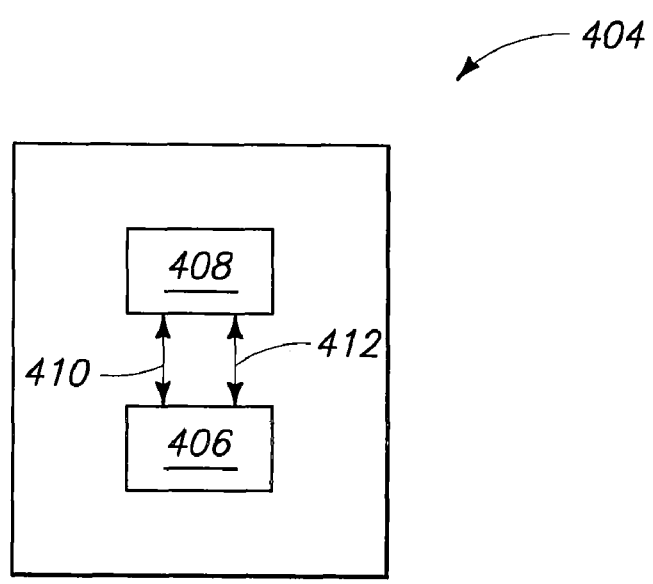
_Fig. 28_

US 7,948,030 B2

SEMICONDUCTOR CONSTRUCTIONS OF MEMORY DEVICES WITH DIFFERENT SIZES OF GATELINE TRENCHES

RELATED PATENT DATA

This patent resulted from a continuation of U.S. patent application Ser. No. 12/628,910, which was filed Dec. 1, 2009, issued Oct. 5, 2010 as U.S. Pat. No. 7,808,041, and which is hereby incorporated herein by reference; which resulted from a divisional of U.S. patent application Ser. No. 11/652,863, which was filed Jan. 12, 2007 issued Jan. 19, 2010, as U.S. Pat. No. 7,648,915, and which is hereby incorporated herein by reference.

TECHNICAL FIELD

Semiconductor constructions, methods of forming semiconductor constructions, and methods of recessing materials within openings.

BACKGROUND

Semiconductor fabrication may involve recessing multiple materials to about the same depth as one another. For instance, a semiconductor construction may contain an isolation region comprising multiple electrically insulative materials, and it may be desired to recess all of such insulative materials to about the same depth as one another.

The semiconductor construction may contain a surface comprising metal and/or semiconductor material. Such surface may be exposed to an etch utilized to etch the electrically insulative materials of the isolation region. It may be desired that the surface remain substantially unaltered by the etch utilized to etch the electrically insulative materials of the isolation region. For instance, such surface may be utilized to support circuit devices, such as transistors. Thus, it may be desired to selectively etch the electrically insulative materials of the isolation region relative to the metal and/or semiconductor material of the surface.

A continuing goal of semiconductor fabrication is to reduce the number of processing steps. Such may improve throughput of devices through a fabrication process. Also, since each step carries a risk of error, reduction of the number of process steps may improve overall quality of devices. Accordingly, it is desired that methods developed for recessing multiple materials to about the same depth as one another utilize few process steps, and it may be desired that the methods utilize a single etch to recess the multiple materials.

BRIEF DESCRIPTION OF THE DRAWINGS

FIGS. 1 and 2 are diagrammatic cross-sectional views of a portion of a semiconductor wafer processed according to an embodiment of the invention.

FIGS. 5 and 6 are a diagrammatic top view and a cross-sectional side view of a portion of semiconductor wafer at a processing stage of an embodiment of the invention. The cross-section of FIG. 6 is along the line 6-6 of FIG. 5.

FIGS. 7-9 are a diagrammatic top view and cross-sectional side views of the portion of the semiconductor wafer of FIGS. 5 and 6 shown at a processing stage subsequent to that of FIGS. 5 and 6. The cross-section of FIG. 8 is along the lines 8-8 of FIGS. 7 and 9; and the cross-section of FIG. 9 is along the lines 9-9 of FIGS. 7 and 8.

FIGS. 10-12 are a diagrammatic top view and cross-sectional side views of the portion of the semiconductor wafer of FIGS. 5 and 6 shown at a processing stage subsequent to that of FIGS. 7-9. The cross-section of FIG. 11 is along the lines 11-11 of FIGS. 10 and 12; and the cross-section of FIG. 12 is along the lines 12-12 of FIGS. 10 and 11.

FIGS. 13-15 are a diagrammatic top view and cross-sectional side views of the portion of the semiconductor wafer of FIGS. 5 and 6 shown at a processing stage subsequent to that of FIGS. 10-12. The cross-section of FIG. 14 is along the lines 14-14 of FIGS. 13 and 15; and the cross-section of FIG. 15 is along the lines 15-15 of FIGS. 13 and 14.

FIGS. 23-26 are a diagrammatic top view and cross-sectional side views of the portion of the semiconductor wafer of FIG. 19 shown at a processing stage subsequent to that of FIGS. 20-22. The cross-section of FIG. 24 is along the lines 24-24 of FIGS. 23 and 26, the cross-section of FIG. 25 is along the lines 25-25 of FIGS. 23 and 26, and the cross-section of FIG. 26 is along the lines 26-26 of FIGS. 23-25.

FIG. 27 is a diagrammatic view of a computer embodiment.

FIG. 28 is a block diagram showing particular features of the motherboard of the FIG. 27 computer embodiment.

DETAILED DESCRIPTION OF THE ILLUSTRATED EMBODIMENTS

Figure 3:
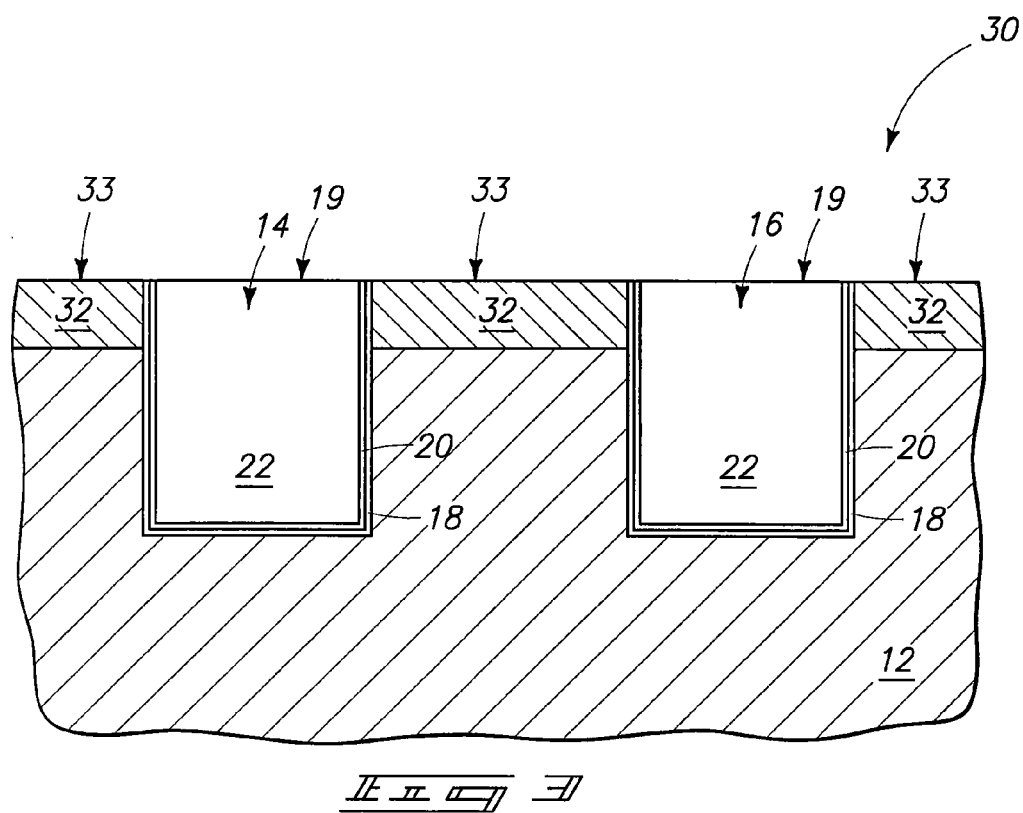
FIGS. 3 and 4 are diagrammatic cross-sectional views of a portion of a semiconductor wafer processed according to an embodiment of the invention.

Some embodiments of the invention pertain to methods of etching multiple materials with a single step etch. The materials may be within an opening, and may be etched selectively relative to a surface adjacent the opening. The materials may be etched to about the same depth as one another within the opening to form a substantially flat bottom profile at a particular depth within the opening.

An embodiment of the invention is described with reference to FIGS. 1 and 2.

FIG. 1 shows an in-process semiconductor construction 10. The construction comprises a semiconductor base 12 having openings (or cavities) 14 and 16 extending therein. Base 12 comprises a semiconductor composition, and may, for example, comprise, consist essentially of, or consist of monocrystalline silicon. The term "semiconductor composition" is utilized to refer to any composition containing a semiconductor material, and may be, at least in part, electrically insulative, electrically semiconductive, or electrically conductive depending on the dopant content within such semiconductor material. Base 12 may also be considered to be a semiconductor substrate, or portion of a semiconductor substrate. The terms "semiconductive substrate", "semiconductor construction" and "semiconductor substrate" mean any structures comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Semiconductor base 12 is shown cross-hatched in FIG. 1. Such cross-hatching is utilized to assist in distinguishing the semiconductor composition of base 12 from other materials, and not to indicate an electrical conductivity of the semiconductor composition of base 12.

The openings 14 and 16 are filled with materials 18, 20 and 22. Materials 18, 20 and 22 may be electrically insulative, and may form isolation regions within the openings 14 and 16. If materials 18, 20 and 22 are electrically insulative, they may correspond to a first silicon dioxide-containing composition, a silicon nitride-containing composition, and a second silicon dioxide-containing composition, respectively. The first and second silicon dioxide-containing compositions 18 and 22 may comprise, consist essentially of, or consist of silicon oxide. First silicon dioxide-containing composition 18 may be formed by thermal oxidation of a silicon-containing semiconductor composition of base 12 and/or by chemical vapor deposition (CVD) utilizing, for example, tetraethylorthosilicate (TeOS). Second silicon dioxide-containing composition 22 may be formed as a spin-on glass (SOG). The first silicon dioxide-containing composition may be more dense than the second silicon dioxide-containing composition. The density of the silicon oxide-containing compositions refers to an etch rate of the compositions in hydrofluoric acid; with denser compositions etching more slowly than less dense compositions. Silicon dioxide-containing compositions 18 and 22 may differ from one another in more than density. For instance, composition 18 may be a doped silicon dioxide material, such as borophosphosilicate glass, phosphosilicate glass, etc.; while composition 22 may an undoped silicon dioxide, or may be doped with different dopant or to a different level than composition 18.

Silicon nitride-containing material 20 may comprise, consist essentially of, or consist of silicon nitride.

The construction of FIG. 1 may be considered to comprise two different surface regions. The first surface region is labeled 17 and corresponds to surfaces external of openings 14 and 16; and specifically corresponds to a surface of semiconductor base 12. The second surface region is labeled 19 and corresponds to surfaces within openings 14 and 16; and specifically corresponds to surfaces of the materials 18, 20 and 22. The first surface region 17 may be considered to comprise a first composition, and the second surface region may be considered to comprise three different materials (the materials 18, 20, 22) which differ in composition from the first composition. The surface regions 17 and 19 are shown to be substantially planar with one another. Such may result from, for example, a planarizing etch (for instance, chemical-mechanical polishing).

Referring to FIG. 2, surface regions 17 and 19 are exposed to an etchant which recesses surface 19 into openings 14 and 16. More specifically, the etchant recesses the three materials 18, 20 and 22 into the openings 14 and 16. The three materials may be recessed to about the same depth as one another (as shown) so that surface 19 remains substantially planar to form a substantially flat bottom profile within the openings. The etchant may comprise suitable characteristics so that etching substantially ceases upon reaching a particular depth within openings 14 and 16. For instance, a balance may occur between the rate that reactant reaches the bottom of the openings and the rate that product drifts out of the openings so that the etch rate effectively stops at a particular depth. Such depth may depend on the dimensions of the openings, with wider openings being suitable for deeper etching than narrower openings. The three materials 18, 20 and 22 may etch at different rates utilizing the etchant, but still all end up at the same depth within the opening due to the etch stop being determined by the depth within the openings. For instance, if material 22 etches faster than material 18, the material 22 will reach the limiting depth faster than material 18, but then etching of material 22 will cease while the etching of material 18 continues until material 18 also reaches such limiting depth.

Suitable etchant chemistry may be heavy polymerizing chemistry. For instance, if materials 18, 20 and 22 comprise the first silicon dioxide-containing material, silicon nitride-containing material, and second silicon dioxide-containing material discussed above, the etch chemistry may utilize etchant comprising $C_4F_6$ and $C_4F_8$. The depth of openings formed utilizing such etchant may be at least partially dependent on the ratio of $C_4F_6$ to $C_4F_8$. In example embodiments, the ratio of $C_4F_6$ to $C_4F_8$ may be from about 1:1 to about 1:10, and in some instances may be from about 1:1 to about 1:3. The etchant may comprise $CH_2F_2O_2$, helium (He) and argon (Ar) in addition to the $C_4F_6$ and $C_4F_8$. An example etchant composition that may be flowed through an etching chamber comprises about 10 standard cubic centimeters per minute (sccm) $C_4F_8$, about 10 sccm $C_4F_6$, about 300 sccm argon, about 10 sccm $CH,F_2$, and about 70 sccm $HeO_2$ (with the $O_2$ being present to about 20 mole percent). The etching may be conducted while the etchant is at a pressure of about 50 millitorr, utilizing plasma maintained at a power of about 1350 watts at about 27 megahertz, and utilizing a substrate bias of about 900 watts at about 2 megahertz.

The etchant removes materials 18, 20 and 22 substantially selectively relative to the semiconductor composition of base 12. An etch is considered "selective" for a first material relative to a second material if the etch removes the first material at a faster rate than the second material. The etchant may remove materials 18, 20 and 22 at a much faster rate than the semiconductor composition of base 12, which may include, but is not limited to, embodiments in which removal of materials 18, 20 and 22 is 100 percent selective relative to the removal of the semiconductor composition of base 12.

Figure 4:
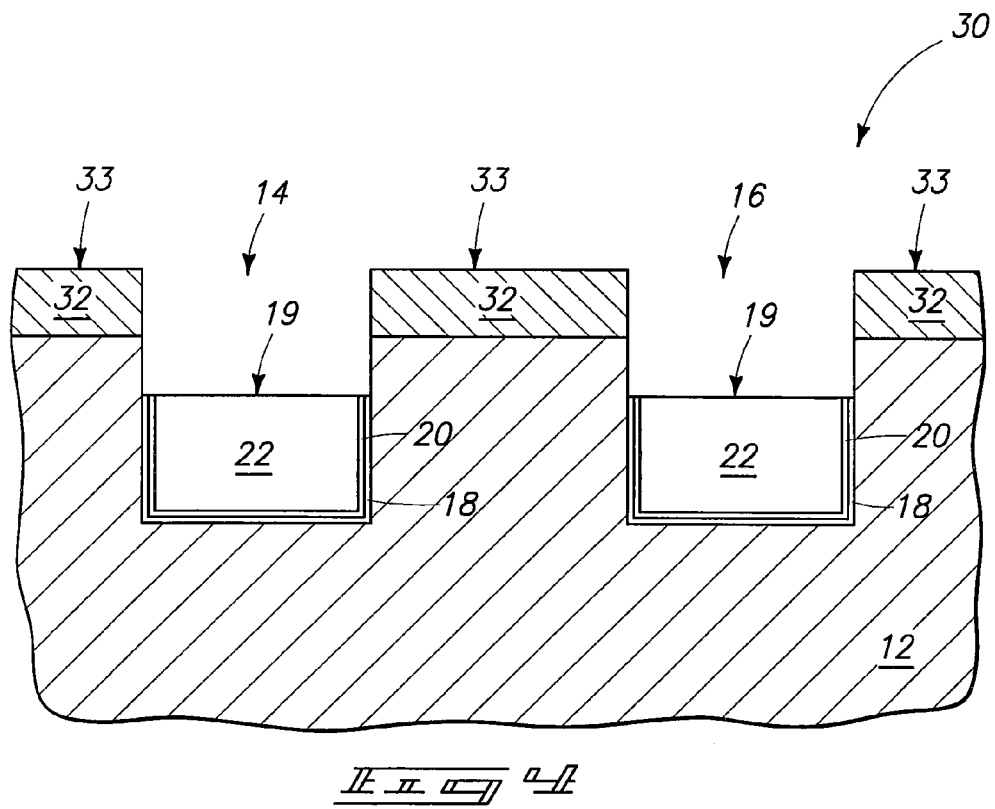

The above-discussed etchant may remove materials 18, 20 and 22 selectively relative to other compositions besides the semiconductor composition of base 12. For instance, the etchant may also be selective for removal of silicon dioxide-containing materials and silicon nitride-containing materials relative to metal-containing materials. FIGS. 3 and 4 illustrate an embodiment in which materials 18, 20 and 22 are selectively removed relative to a metal-containing material. In referring to FIGS. 3 and 4, similar numbering will be used as is utilized above in referring to FIGS. 1 and 2, where appropriate.

FIG. 3 shows a semiconductor construction 30 comprising semiconductor base 12, openings 14 and 16, and materials 18, 20 and 22 within the openings. Semiconductor base 12 and materials 18, 20, 22 may comprise the same compositions discussed above with reference to FIG. 1. A metal-containing composition 32 is provided over semiconductor base 12, and the openings are shown to extend through the metal-containing composition. The metal-containing composition may comprise, consist essentially of, or consist of one or more metals (such as, for example, transition metals), and/or one or more metal compounds (such as metal silicides, metal nitrides, etc.). The materials 18, 20 and 22 together comprise the second surface 19 discussed above. Metal-containing composition 32 comprises a first surface 33 analogous to the first surface 17 discussed above with reference to FIG. 1, but containing metal of the metal-containing composition 32.

Referring to FIG. 4, materials 18, 20 and 22 are recessed within openings 14 and 16 utilizing etching of the type discussed above with reference to FIG. 2. Such etching recesses upper surfaces of materials 18, 20 and 22 to a common height within openings 14 and 16; and etches materials 18, 20 and 22 selectively relative to metal-containing composition 32.

Some embodiments of the invention include applications for fabrication of finFET-type structures (with finFETs being fin-containing field effect transistors). An example embodiment is described with reference to FIGS. 5-18.

FIGS. 5 and 6 show a semiconductor construction 40. Construction 40 comprises a semiconductor substrate 41. The semiconductor substrate includes a semiconductor base 42 and an electrically insulative isolation region 44 supported by the semiconductor base.

Semiconductor base 42 may comprise the same compositions discussed above for the semiconductor composition of base 12 (FIG. 1), and accordingly may comprise, consist essentially of, or consist of monocrystalline silicon. Semiconductor base 12 may be considered a semiconductor material in some embodiments.

Isolation region 44 comprises the three materials 18, 20 and 22 discussed above with reference to FIG. 1, which may be a first silicon oxide-containing composition, a silicon nitride-containing composition, and a second silicon oxide-containing composition, respectively. The first and second silicon oxide-containing compositions may differ from one another at least in density.

Semiconductor base 42 comprises projections 46 extending upwardly through the isolation region 44. The projections correspond to mesas (or islands)-laterally surrounded by the electrically insulative material of the isolation region 44.

Referring to FIGS. 7-9, a patterned mask 48 is formed over substrate 41. The patterned mask may comprise, for example, photolithographically patterned photoresist.

The patterned mask has a plurality of trenches 50, 52, 54 and 56 extending therethrough. The trenches expose portions of the islands of semiconductor base 42, and expose portions of isolation region 44. Portions of the projections 46 covered by masking material 48 are shown in dashed-line view in FIG. 7 to assist the reader in understanding the locations of the semiconductor material islands relative to the trenches. Also, portions of insulative materials 18 and 20 are shown in dashed-line view in FIG. 7 to further assist the reader in understanding locations of various structures.

The trenches are paired across individual islands. For instance, one of the islands is labeled 58 in FIGS. 7-9, and the trenches 50 and 52 are shown to extend across such island. The paired trenches 50 and 52 may be referred to as a first mask trench and a second mask trench, respectively.

Figure 12:
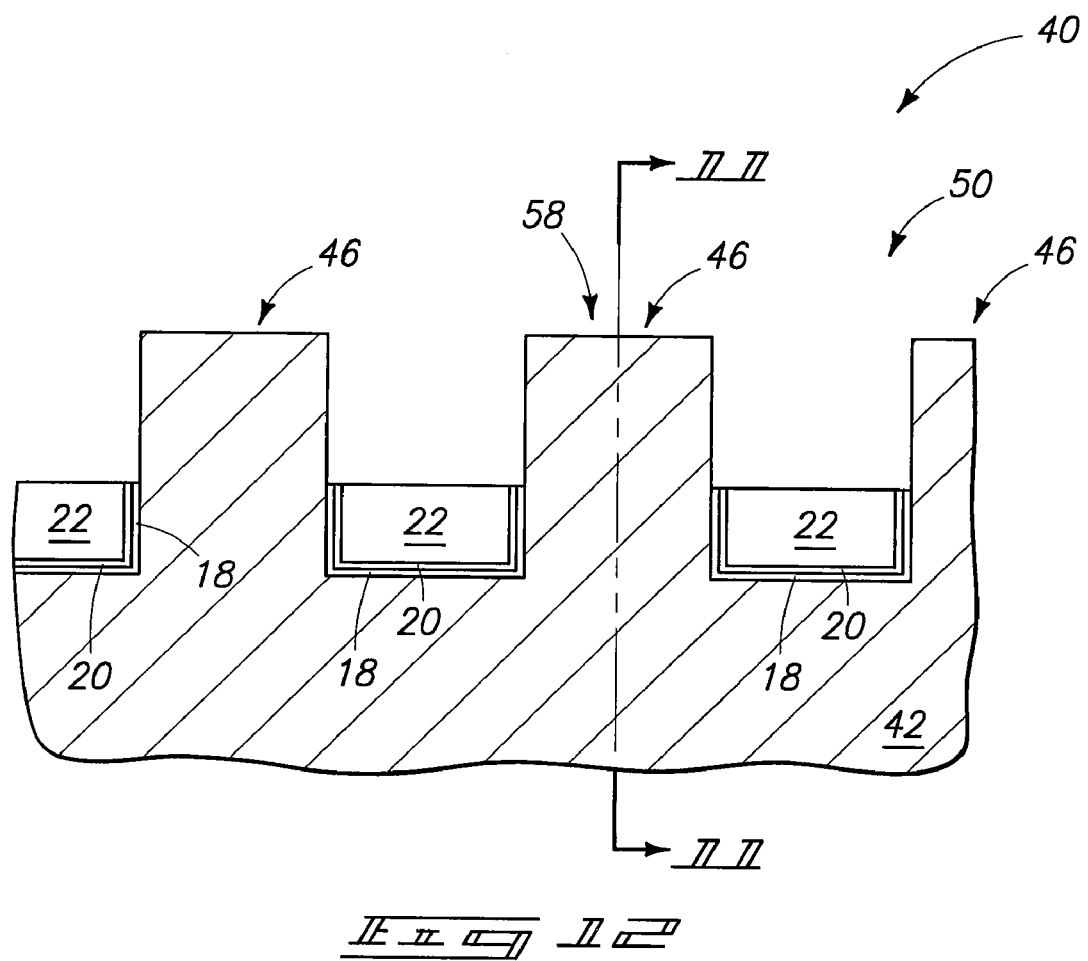

Referring to FIGS. 10-12, the semiconductor base 42 and insulative materials 18, 20, 22 exposed within trenches 50, 52, 54 and 56 are subjected to etchant. The etchant comprises $C_4F_6$ and $C_4F_8$ under conditions analogous to those discussed above regarding FIG. 2. Such selectively etches materials 18, 20 and 22 relative to semiconductor material of base 42. Further, the etching recesses materials 18, 20 and 22 to about the same depth as one another within the trenches, as shown in the cross-section of FIG. 12 along trench 50.

The etching into materials 18, 20 and 22 extends trenches 50, 52, 54 and 56 into such insulative materials extending between islands 46. The trenches 50, 52, 54 and 56 within materials 18, 20, 22 may be referred to as gateline trenches. The gateline trench formed by extending the first mask trench 50 may be referred to as a first gateline trench, and the gateline trench formed by extending the second mask trench 52 may be referred to as a second gateline trench.

The semiconductor material of the islands extending between the gateline trenches has fin-type shapes. Specifically, the semiconductor material extends upwardly to an elevation above the recessed materials 18, 20 and 22 within the gateline trenches.

Figure 15:
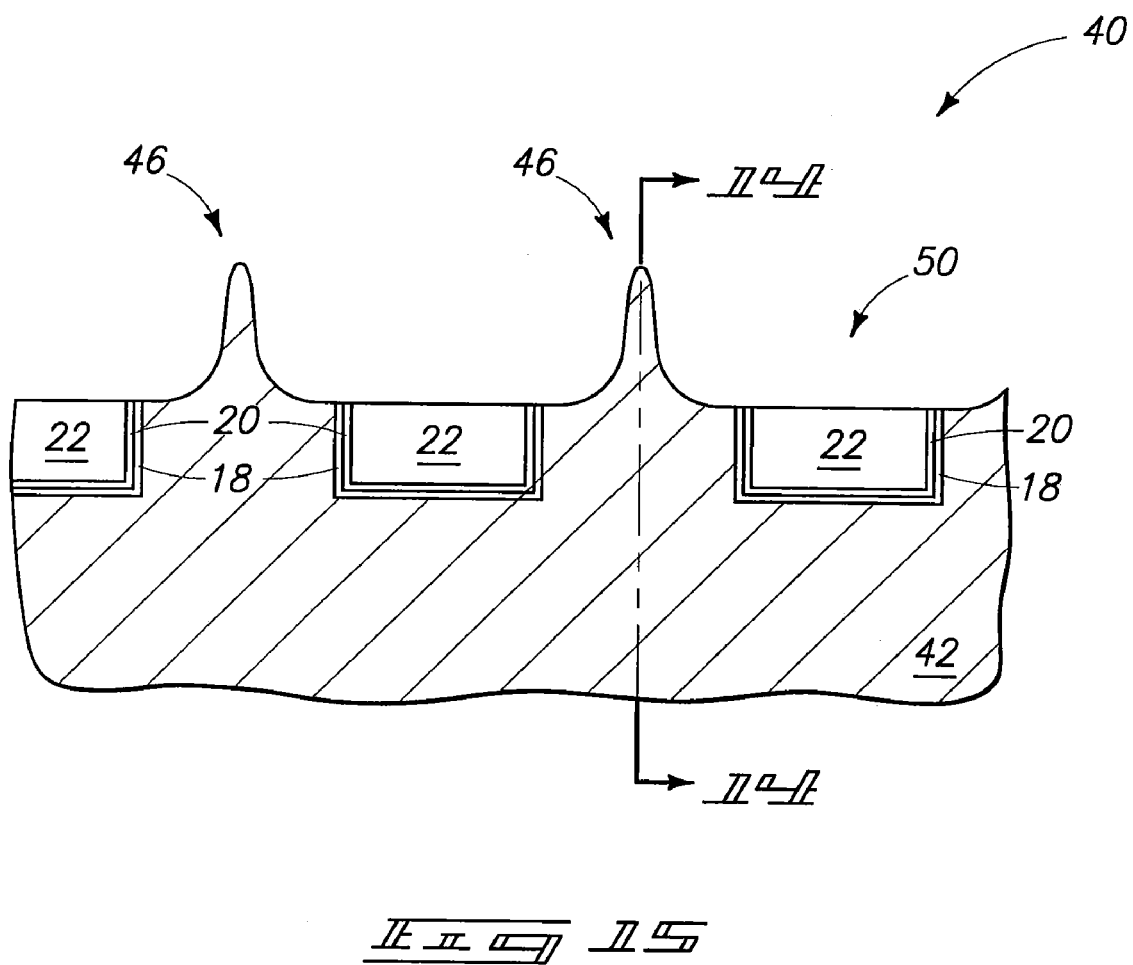

Referring to FIGS. 13-15, portions of semiconductor islands 46 exposed within trenches 50, 52, 54 and 56 are subjected to an isotropic etch. Such extends the gateline trenches into the semiconductor material of the islands. Such modifies the fin-type shapes of the semiconductor material exposed within trenches 50, 52, 54 and 56. The etchant utilized to recess materials 18, 20 and 22 may be referred to as a first etchant, while the etchant utilized for isotropic etching of semiconductor material islands 46 may be referred to as a second etchant. The etching utilized for the isotropic etching of the semiconductor material of the islands may be any suitable etch. In embodiments in which the islands comprise monocrystalline silicon, the etch may be, for example, conducted in a LAM514 chamber at a pressure of about 60 millitorr, with a substrate bias of 0, with a TCP power of about 600 watts, with a flow rate of He of about 400 sccm, and with a flow rate of $NF_3$ of about 80 sccm.

Figure 16:
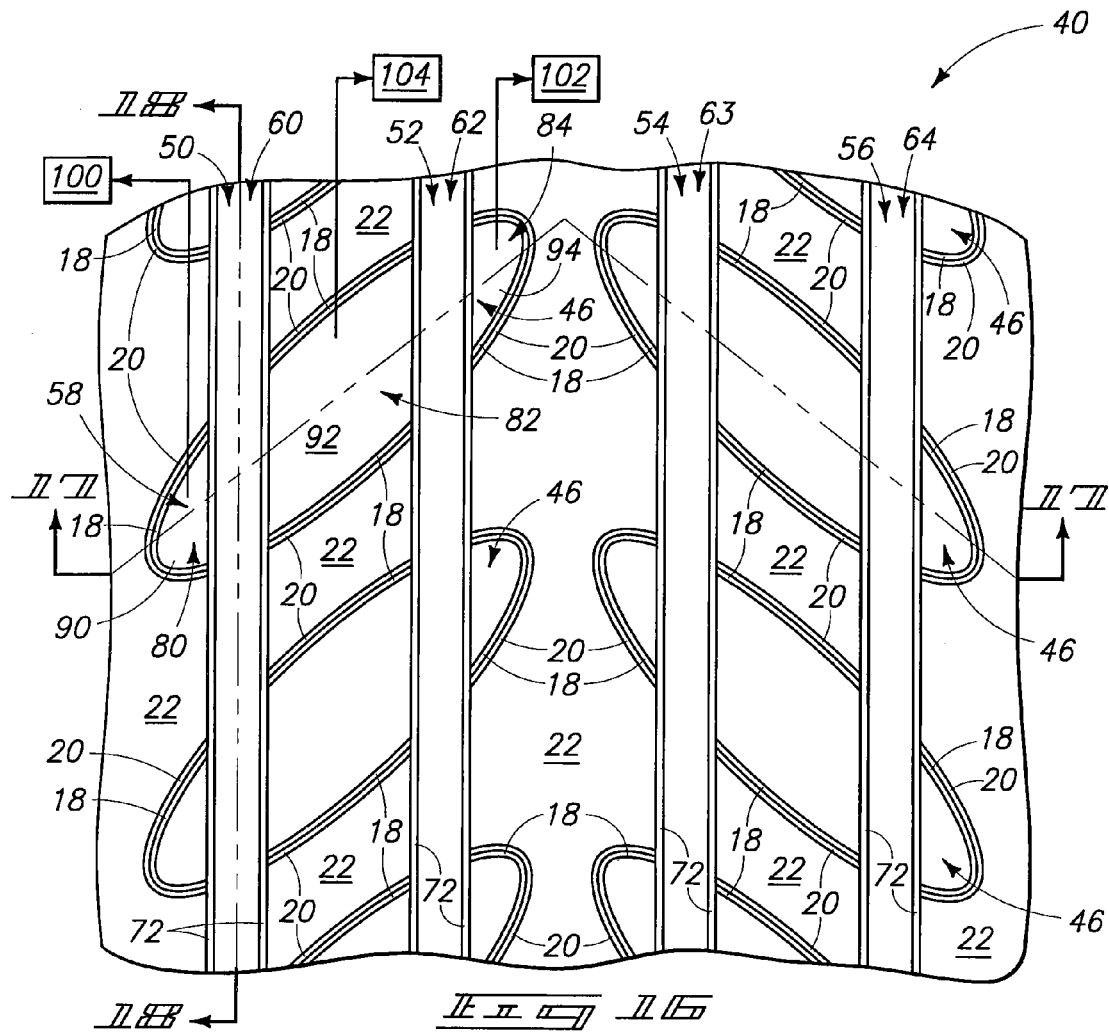
FIGS. 16-18 are a diagrammatic top view and cross-sectional side views of the portion of the semiconductor wafer of FIGS. 5 and 6 shown at a processing stage subsequent to that of FIGS. 13-15. The cross-section of FIG. 17 is along the lines 17-17 of FIGS. 16 and 18; and the cross-section of FIG. 18 is along the lines 18-18 of FIGS. 16 and 17.
Figure 17:
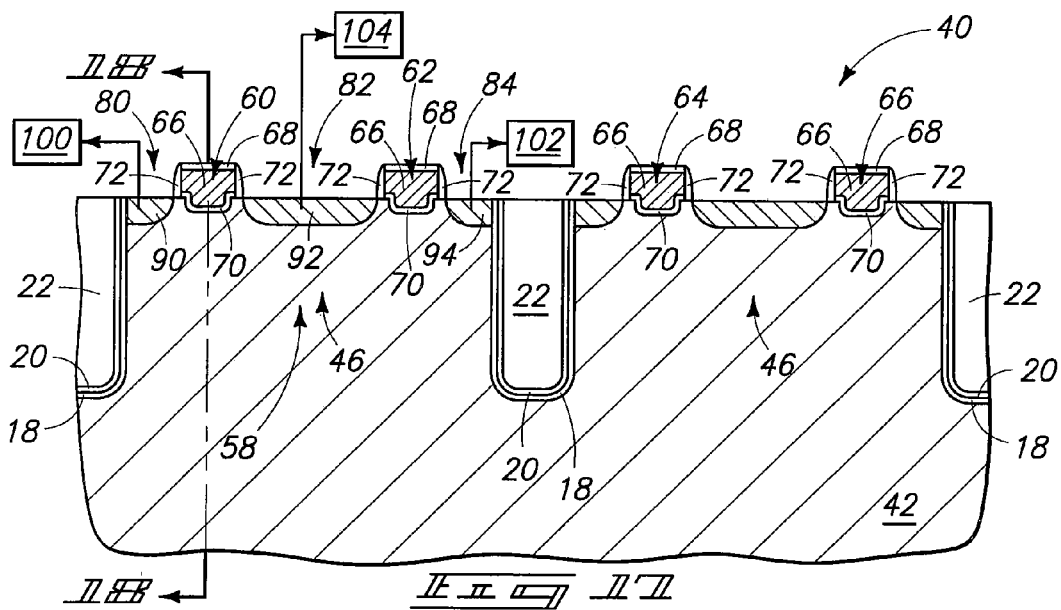
Figure 18:
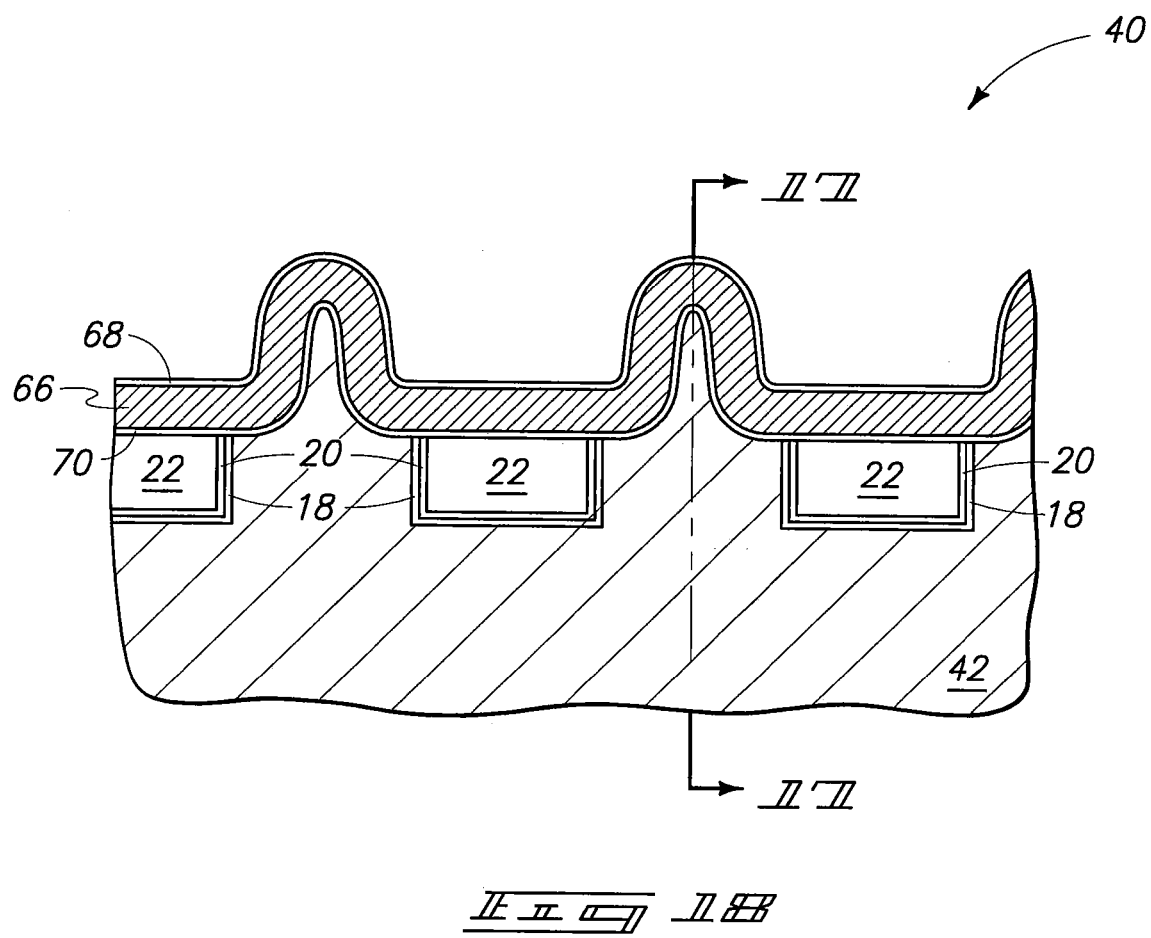

Referring to FIGS. 16-18, masking material 48 (FIGS. 13-15) is removed, and gatelines 60, 62, 63 and 64 are formed within the gateline trenches 50, 52, 54 and 56, respectively. The gatelines comprise electrically conductive gateline material 66, and an electrically insulative capping material 68 over the electrically conductive material 66. Electrically conductive material 66 may comprise any suitable composition or combination of compositions, including, for example, one or more of various metals, metal-containing compounds, and conductively-doped semiconductor materials. Electrically insulative material 68 may comprise any suitable composition or combination of compositions, including, for example, one or more of silicon dioxide, silicon nitride, and silicon oxynitride.

Gate dielectric material 70 is formed over the semiconductor material of projections 46 prior to forming the electrically conductive material 66. Gate dielectric 70 may, for example, comprise silicon dioxide thermally grown from a silicon-containing semiconductor material of projections 46. Alternatively, or additionally, the gate dielectric may be formed by chemical vapor deposition of dielectric material within the gateline trenches prior to formation of lines 60, 62, 63 and 64. The gatelines and dielectric material may be patterned by forming a stack comprising the dielectric material and gateline materials across an upper surface of the construction resulting from the processing of FIGS. 13-15, providing a photolithographically patterned photoresist mask over such stack to define locations of the gatelines, transferring a pattern from the mask to the underlying stack with one or more suitable etches, and then removing the mask to leave the construction of FIGS. 16-18.

Sidewall spacers 72 are formed along sidewalls of the gatelines. The sidewall spacers may comprise any suitable composition or combination of compositions, and may, for example, comprise, consist essentially of, or consist of one or more of silicon oxide, silicon nitride and silicon oxynitride. The sidewall spacers may be formed by providing a layer of spacer material over the gatelines and over surfaces between the gatelines, and then anisotropically etching such spacer material.

The gatelines are paired across individual islands 46 of the semiconductor material. For instance, the lines 60 and 62 are paired across island 58. The paired gatelines 60 and 62 divide island 58 into three regions 80, 82 and 84. Such regions may be considered to correspond to an inner region 82 between the paired gatelines, a first outer region 80 which is laterally outward of gateline 60, and a second outer region 84 which is laterally outward of gateline 62. Such three regions are conductively doped to form source/drain regions 90, 92 and 94. The source/drain regions may be considered to be a first source/drain region formed in the first outer region 80, a second source/drain region formed in the inner region 82, and a third source/drain region formed in the outer region 84. First and second source/drain regions 90 and 92 are gatedly connected to one another through gateline 60 (specifically electrical flow through gateline 60 may cause electrical coupling of source/drain regions 90 and 92 through a channel region underlying gateline 60); and second and third source/drain regions 92 and 94 are gatedly connected to one another through gateline 62 (specifically, electrical flow through gateline 62 may cause electrical coupling of source/drain regions 92 and 94 through a channel region underlying gateline 62). Source/drain regions analogous to regions 90, 92 and 94 may be formed within all of the islands. Such additional source/drain regions are not labeled in FIG. 16 in order to simplify the drawing.

The outer source/drain regions 90 and 94 may be electrically coupled with capacitor constructions 100 and 102 (diagrammatically illustrated in FIGS. 16 and 17), and the inner source/drain region 92 may be electrically coupled with a bitline 104 (diagrammatically illustrated in FIGS. 16 and 17) to form a pair of dynamic random access memory (DRAM) unit cells. Similar unit cells may be formed from source/drain regions associated with others of the islands to create a DRAM array.

Another embodiment of the invention is described with reference to FIGS. 19-26. In referring to FIGS. 19-26, similar numbering will be used as is utilized above in describing the embodiment of FIGS. 5-18, where appropriate.

Figure 19:
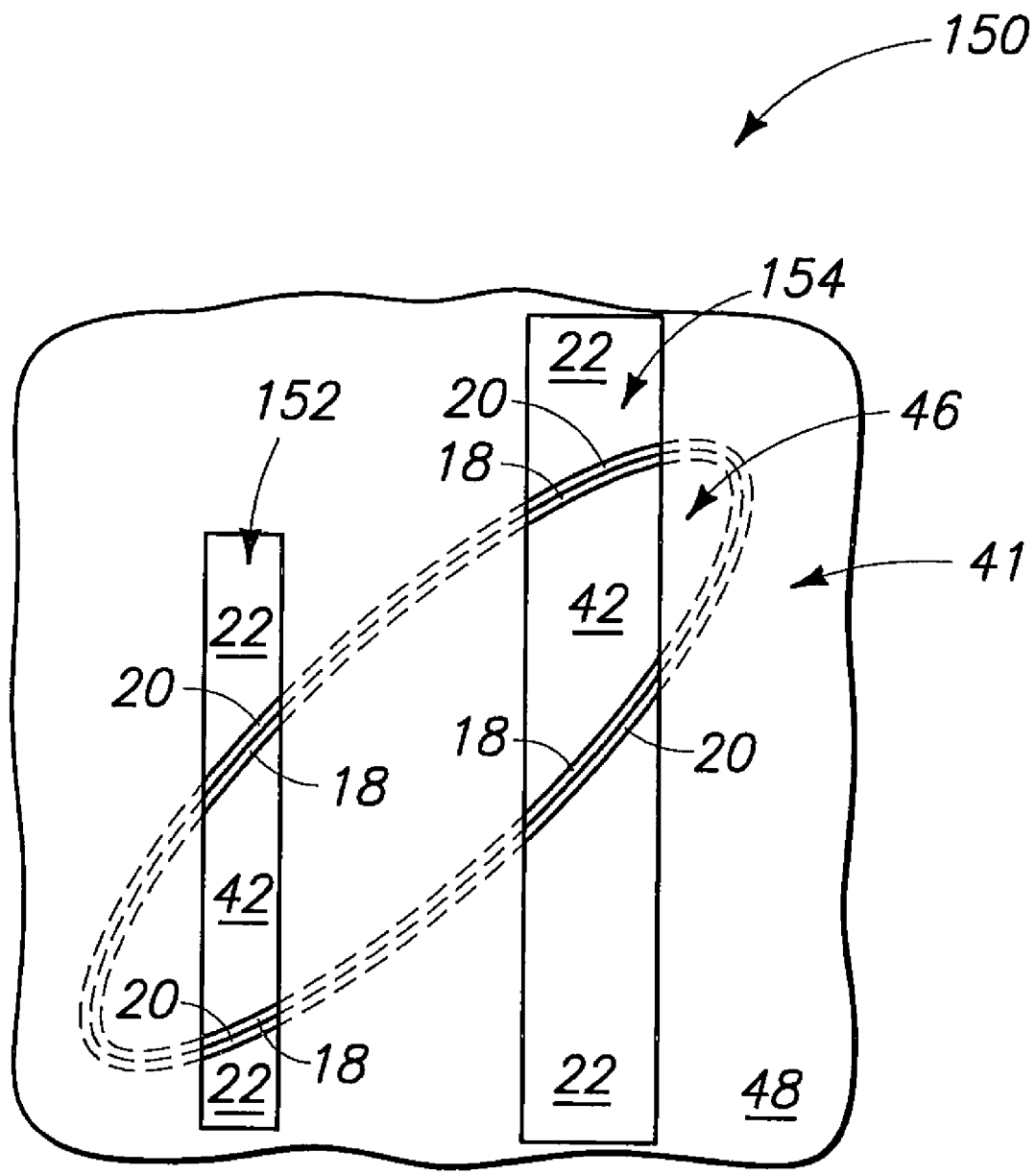
FIG. 19 is a diagrammatic top view of a portion of a semiconductor wafer at a processing stage of an embodiment of the invention. The processing stage of FIG. 19 is similar to that of FIG. 7.

FIG. 19 shows a semiconductor construction 150 at a processing stage comparable to that of FIGS. 7-9. The construction includes a patterned masking material 48 having trenches 152 and 154 extending therethrough. The trenches 152 and 154 may be referred to as first and second mask trenches, respectively. The construction also includes an island 46 of semiconductor base 42, with such island being laterally surrounded by isolation region 41 comprising electrically insulative materials 18, 20 and 22.

The construction of FIG. 19 is similar to that of FIGS. 7-9, but differs in that trenches 152 and 154 are of different lengths relative to one another, and are of different widths relative to one another. Specifically, trench 154 is longer and wider than trench 152. Thus, trench 154 has bigger dimensions than trench 152, which may enable the materials exposed within trench 154 to be more deeply etched than those within trench 152 when the etching conditions of FIG. 2 are employed. Although trench 154 is shown to differ in both length and width from trench 152, in other embodiments trench 154 may differ only in length or only in width from trench 152. The differences in dimensions between trenches 154 and 152 may be any suitable differences which achieve a desired difference in depth of etching within the trenches. For instance, trench 154 may be at least 10 percent longer than trench 152, at least 25 percent longer, or even at least 50 percent longer; and/or may be at least 10 percent wider than trench 152, at least 25 percent wider, or even at least 50 percent wider.

Figure 20:
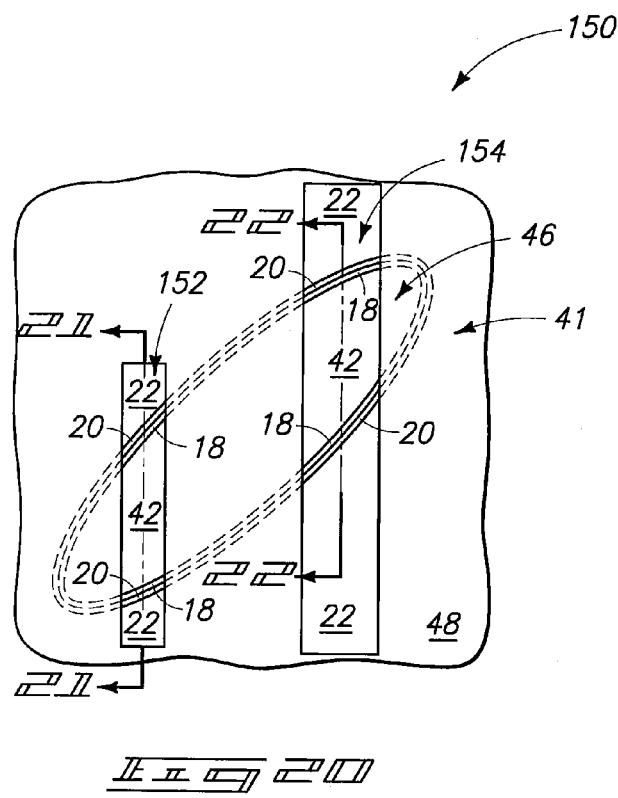
FIGS. 20-22 are a diagrammatic top view and cross-sectional side views of the portion of the semiconductor wafer of FIG. 19 shown at a processing stage subsequent to that of FIG. 19. The cross-section of FIG. 21 is along the line 21-21 of FIG. 20, and the cross-section of FIG. 22 is along the line 22-22 of FIG. 20.
Figures 21, 22:
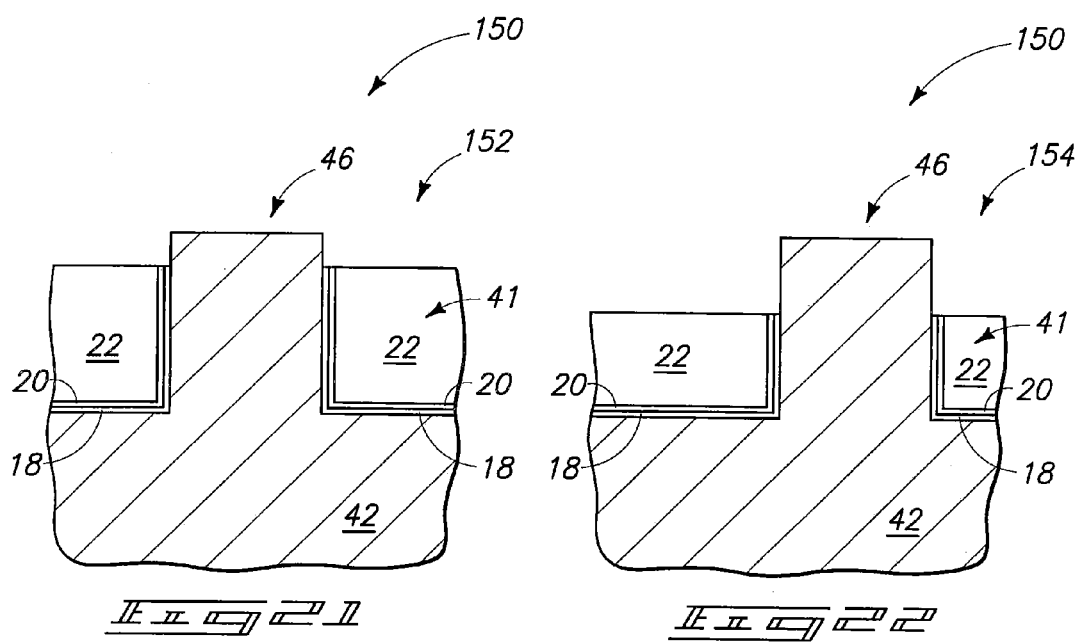

Referring to FIGS. 20-22, construction 150 is shown after etching of the type discussed above with reference to FIG. 2, and accordingly at a processing stage comparable to that of FIGS. 10-12. The etching has recessed materials 18, 20 and 22 within trenches 152 and 154 selectively relative to the semiconductor composition of base 42. FIGS. 21 and 22 show cross-sections along trenches 152 and 154, respectively, and illustrate that trench 154 is recessed deeper into materials 18, 20 and 22 than the trench 152. Such additional depth of the recessing of trench 154 results from the larger dimensions of the trench.

The recessed materials 18, 20 and 22 form gateline trenches comparable to those discussed above with reference to FIGS. 10-12. The gateline trench formed by extending trench 152 may be referred to as a first gateline trench, and that formed by extending trench 154 may be referred to as a second gateline trench. The depth of the second gateline trench relative to the first gateline trench may be controlled, at least in part, by the relative dimensions of the second mask trench to the first mask trench. The second gateline trench may be at least 10 percent deeper than the first gateline trench, or in some embodiments may at least 30 percent deeper than the first gateline trench.

Referring to FIGS. 23-26, masking material 48 (FIGS. 20-22) is removed, exposed portions of base 42 are subjected to an isotropic etch analogous to that discussed above with reference to FIGS. 13-15, and gatelines 160 and 162 are formed within gateline trenches 152 and 154, respectively. Gatelines 160 and 162 comprise the electrically conductive gate material 66 and electrically insulative capping material 68 that were discussed above with reference to FIGS. 16-18. Additionally, gate dielectric 70 is provided between the semiconductor material of projections 46 and the electrically conductive gate material 66.

Gateline 162 is wider than gateline 160 in the shown embodiment. The gatelines may be utilized to form logic circuitry, and may comprise the same conductive gate material as one another (as shown) or may comprise different conductive gate material relative to one another in other embodiments. For instance, one of the gatelines may comprise n-type doped semiconductor material as at least a portion of the conductive gate material, while the other comprises p-type doped semiconductor material as at least a portion of the conductive gate material.

An isolation region 170 is shown extending along a central region of the semiconductor material of projection 46 and between gatelines 160 and 162. Isolation region 170 may comprise silicon dioxide, and may be formed at a processing stage subsequent to formation of gatelines 160 and 162, or at any other suitable processing stage. In some embodiments, region oxide of region 170 will be provided simultaneously with oxide 22.

Source/drain regions 172 and 174 are provided proximate gateline 160; and source/drain regions 176 and 178 are provided proximate gateline 162. The source/drain regions may be formed by implanting p-type and/or n-type dopant into semiconductor material 42.

Figure 26:
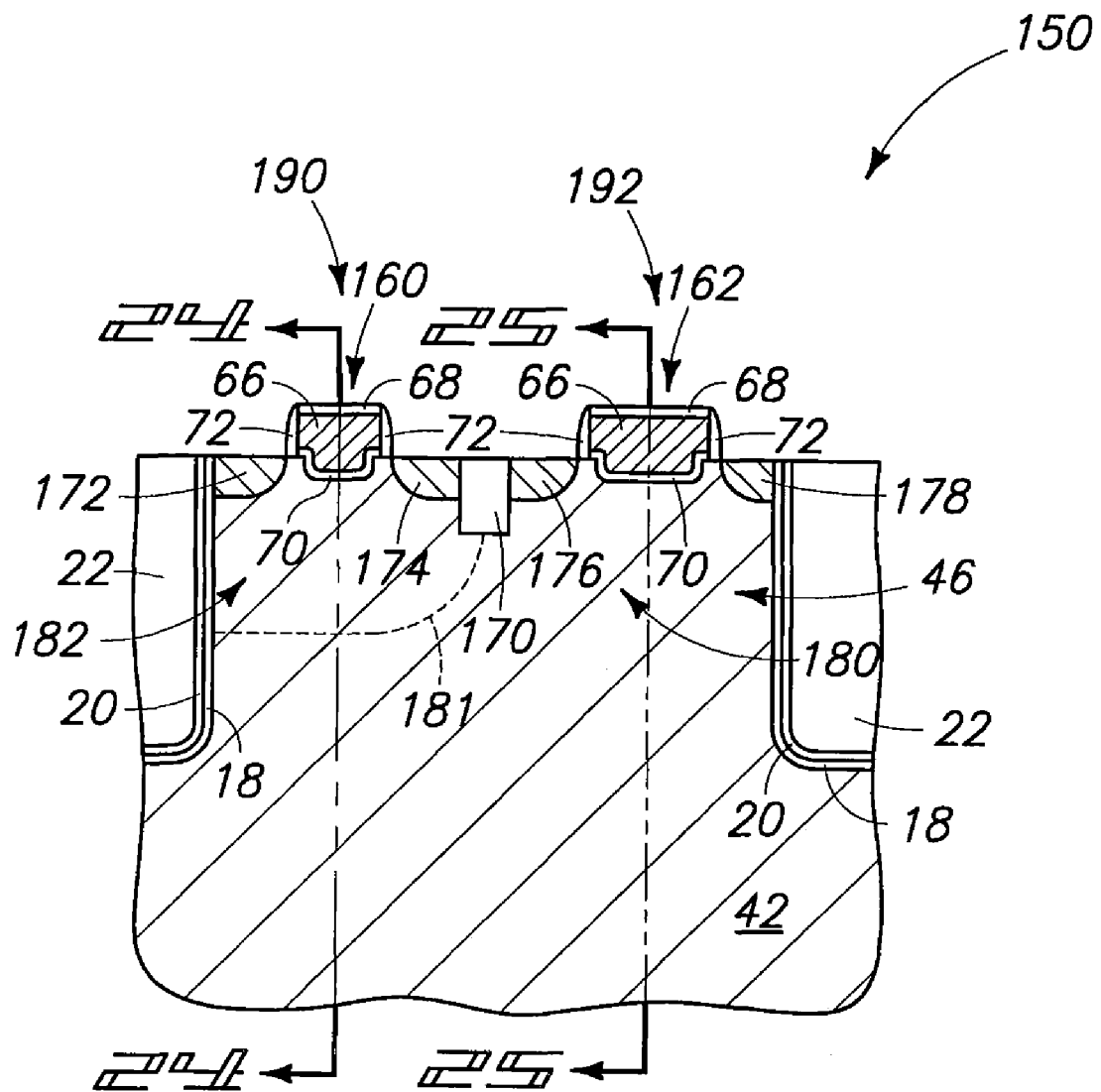

FIG. 26 shows that the projection 46 of semiconductor material 42 comprises a region 180 under gateline 162 and another region 182 under gateline 160. The regions 180 and 182 are diagrammatically illustrated to be separated by a boundary 181. Such boundary may exist in some constructions formed in accordance with embodiments of the invention, and may not exist in other constructions formed in accordance with other embodiments.

The gatelines and source/drain regions form transistors 190 and 192. Transistor 190 comprises source/drain regions 172 and 174, together with a gate defined by gateline 160; and transistor 192 comprises source/drain regions 176 and 178 together with a gate defined by gateline 162. The source/drain regions of each transistor are gatedly coupled to one another through the gate of each transistor.

Transistors 190 and 192 may be p-type metal oxide semiconductor (PMOS) transistors or n-type metal oxide semiconductor (NMOS) transistors; or alternatively one of the transistors may be an NMOS transistor and the other a PMOS transistor to form a CMOS construction. If the transistors are both NMOS transistors, then regions 180 and 182 will be p-type, and source/drain regions 172, 174, 176 and 178 will be n-type. If the transistors are both PMOS transistors, then regions 180 and 182 will be n-type, and source/drain regions 172, 174, 176 and 178 will be p-type. If one of the transistors is a PMOS transistor and the other is an NMOS transistor, then one of regions 180 and 182 will be n-type, and the other p-type; and the source/drain regions within said one of the regions will be p-type while the source/drain regions within said other of the regions will be n-type.

The processing of FIGS. 19-26 forms a pair of gatelines 160 and 162 paired across an island of semiconductor material. In other embodiments, processing similar to that of FIGS. 19-26 may be utilized to form a pair of fin-type structures that have different dimensions relative to one another, and that are not paired across the same island as one another. In other embodiments, processing similar to that of FIGS. 19-26 may be utilized to form more than two fin-type structures that have different dimensions relative to one another.

The processing of FIG. 19 is shown to follow that of FIGS. 7-9. In other embodiments, processing similar to that of FIGS. 19-26 may be conducted on semiconductor constructions having different shapes and/or heights of projections 46 of base 42 than those of FIGS. 7-9. Also, in other embodiments, the processing of FIGS. 5-18 may be utilized with constructions other than that shown in FIGS. 5-18.

Embodiments of the invention may also include electronic systems comprising one or more of the structures described above.

FIG. 27 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reacting data from the memory cells. The addressing and read circuitry may be utilized for conveying information between memory device 408 and processor 406. Such is illustrated in the block diagram of the motherboard 404 shown in FIG. 288. In such block diagram, the addressing circuitry is illustrated as 410 and the read circuitry is illustrated as 412.

Processor device 406 may correspond to a processor module, and associated memory utilized with the module may comprise one or more of the structures described with reference to FIGS. 1-26.

Memory device 408 may correspond to a memory module, and may comprise one or more of the structures described with reference to FIGS. 1-26.

Figure 29:
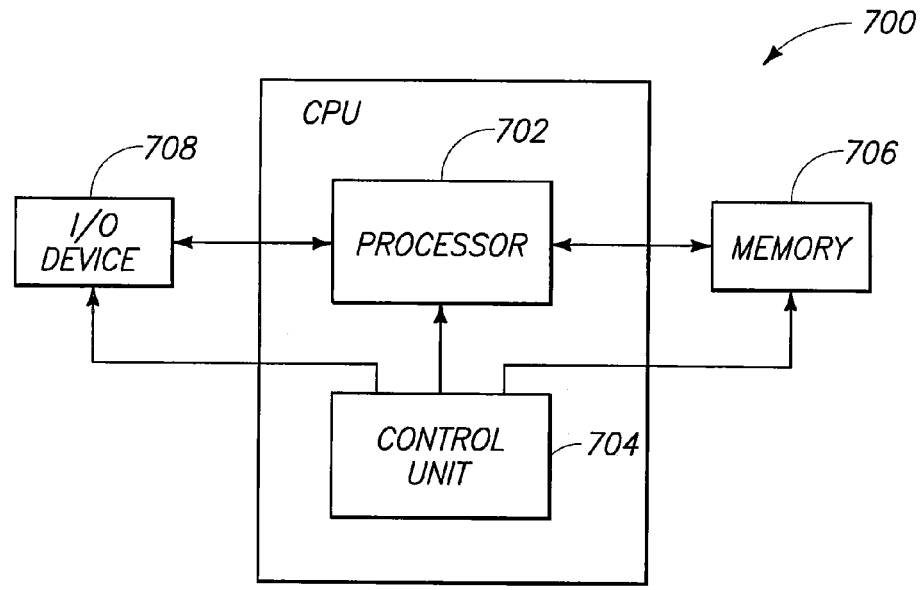
FIG. 29 is a high level block diagram of an electronic system embodiment.

FIG. 29 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include one or more of the structures described with reference to FIGS. 1-26.

Figure 30:
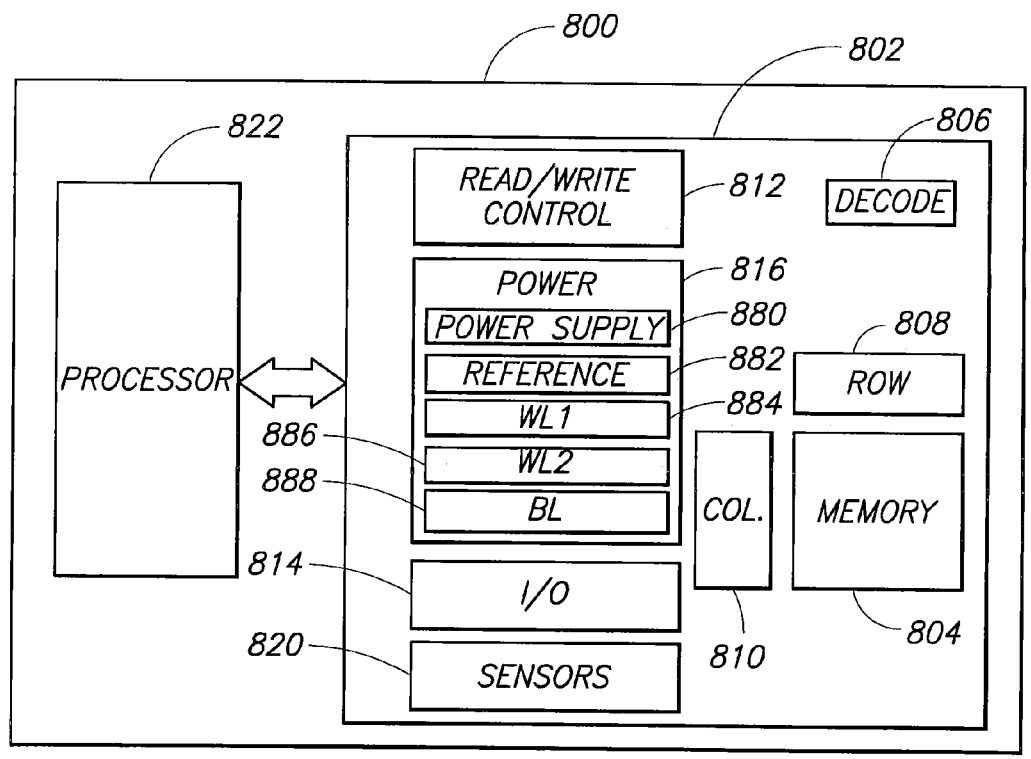
FIG. 30 is a simplified block diagram of a memory device embodiment.

FIG. 30 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include one or more of the structures described with reference to FIGS. 1-26.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
   a semiconductor substrate which includes a projection of semiconductor material laterally surrounded by electrically insulative material;
   a pair of gateline trenches extending into the electrically insulative material; one of the gateline trenches being a first gateline trench, and the other being a second gateline trench; the second gateline trench being deeper than the first gateline trench;
   first gateline material within the first gateline trench;
   second gateline material within the second gateline trench;
   first source/drain regions within the projection and gatedly connected to one another by the first gateline material; and
   second source/drain regions within the projection and gatedly connected to one another by the second gateline material.

2. The construction of claim 1 wherein the second gateline trench is at least 10% deeper than the first gateline trench.

3. The construction of claim 1 wherein the second gateline trench is at least 30% deeper than the first gateline trench.

4. The construction of claim 1 wherein the first and second gateline materials are compositionally the same as one another.

5. The construction of claim 1 wherein:
   the projection comprises p-type background doping;
   the first gateline material and first source/drain regions together comprise a first transistor;
   the second gateline material and second source/drain regions together comprise a second transistor; and
   the first and second transistors are NMOS transistors.

6. The construction of claim 1 wherein:
   the projection comprises n-type background doping;
   the first gateline material and first source/drain regions together comprise a first transistor;
   the second gateline material and second source/drain regions together comprise a second transistor; and
   the first and second transistors are PMOS transistors.

7. The construction of claim 1 wherein:
   the projection comprises a p-type background doped region and an n-type background doped region;
   the first gateline material and first source/drain regions together comprise a first transistor;
   the second gateline material and second source/drain regions together comprise a second transistor; and
   one of the first and second transistors is an NMOS transistor and the other is a PMOS transistor.

8. A semiconductor construction, comprising:
   a semiconductor substrate which includes a projection of semiconductor material laterally surrounded by electrically insulative material;
   a pair of gateline trenches extending into the electrically insulative material; one of the gateline trenches being a first gateline trench, and the other being a second gateline trench; the second gateline trench being wider and deeper than the first gateline trench;
   first gateline material within the first gateline trench, the first gateline material being configured as a first gateline;
   second gateline material within the second gateline trench, the second gateline material being configured as a second gateline which is wider than the first gateline;
   first source/drain regions within the projection and gatedly connected to one another by the first gateline material; and
   second source/drain regions within the projection and gatedly connected to one another by the second gateline material.

9. The construction of claim 8 wherein the semiconductor material comprises monocrystalline silicon.

10. The construction of claim 8 wherein:
    the projection comprises a p-type background doped region and an n-type background doped region;
    the first gateline material and first source/drain regions together comprise a first transistor;
    the second gateline material and second source/drain regions together comprise a second transistor; and
    one of the first and second transistors is an NMOS transistor and the other is a PMOS transistor.

11. The construction of claim 8 wherein the first and second gateline materials are compositionally the same as one another.

* * * * *

UNITED STATES PATENT AND TRADEMARK OFFICE
CERTIFICATE OF CORRECTION

PATENT NO.         : 7,948,030 B2
APPLICATION NO.    : 12/875828
DATED              : May 24, 2011
INVENTOR(S)        : Larson Lindholm et al.

Page 1 of 1

It is certified that error appears in the above-identified patent and that said Letters Patent is hereby corrected as shown below:

On the face page, in field (57), under "Abstract", in column 2, line 3, delete "$C_4F_3$." and insert -- $C_4F_8$. --, therefor.

Signed and Sealed this
Fifth Day of July, 2011

David J. Kappos
*Director of the United States Patent and Trademark Office*